United States Patent
Kim et al.

(10) Patent No.: US 9,647,163 B2
(45) Date of Patent: May 9, 2017

(54) SOLAR CELL HAVING A DOUBLE-SIDED STRUCTURE, AND METHOD FOR MANUFACTURING SAME

(75) Inventors: Tae Whan Kim, Seoul (KR); Qifeng Han, Seoul (KR); Jae Hun Jung, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 157 days.

(21) Appl. No.: 14/001,311

(22) PCT Filed: Feb. 17, 2012

(86) PCT No.: PCT/KR2012/001188
§ 371 (c)(1),
(2), (4) Date: Aug. 23, 2013

(87) PCT Pub. No.: WO2012/115392
PCT Pub. Date: Aug. 30, 2012

(65) Prior Publication Data
US 2013/0327385 A1    Dec. 12, 2013

(30) Foreign Application Priority Data
Feb. 24, 2011  (KR) .................. 10-2011-0016526

(51) Int. Cl.
*H01L 31/0352* (2006.01)
*H01L 31/0725* (2012.01)
(Continued)

(52) U.S. Cl.
CPC .. *H01L 31/0725* (2013.01); *H01L 31/035218* (2013.01); *H01L 31/035227* (2013.01);
(Continued)

(58) Field of Classification Search
CPC .......... H01L 31/0684; H01L 31/03845; H01G 9/2072
See application file for complete search history.

(56) References Cited

U.S. PATENT DOCUMENTS 7,653,560 B2    1/2010  Hueler
2005/0056312 A1*  3/2005  Young et al. ................. 136/258
(Continued)

FOREIGN PATENT DOCUMENTS

FR  WO 2011004329 A1 *  1/2011  ....... H01L 31/02008
KR       10-0567330 B1    3/2006
(Continued)

*Primary Examiner* — Eric R Smith
(74) *Attorney, Agent, or Firm* — Ladas & Parry LLP

(57) ABSTRACT

The present invention relates to a solar cell having nano-structures on both surfaces of a transparent substrate, and to a method for manufacturing same. The nano-structures, which face each other with respect to the substrate and which transport electrons, are formed using zinc-oxide nanowires. Also, a hole-transport layer using CIS nanoparticles is formed in order to absorb light having a short wavelength and to transport generated holes. A hole-transport layer including CIGS nanoparticles for absorbing light having a relatively long wavelength is formed on the side facing the hole-transport layer including the CIS nanoparticles.

5 Claims, 6 Drawing Sheets

(51) Int. Cl.
*H01L 31/0749* (2012.01)
*H01L 31/068* (2012.01)
*H01L 51/42* (2006.01)
*H01L 31/18* (2006.01)

(52) U.S. Cl.
CPC ...... *H01L 31/0684* (2013.01); *H01L 31/0749* (2013.01); *H01L 31/18* (2013.01); *H01L 51/4233* (2013.01); *Y02E 10/541* (2013.01); *Y02P 70/521* (2015.11)

(56) References Cited

U.S. PATENT DOCUMENTS

| | | | |
|---|---|---|---|
| 2007/0204901 A1* | 9/2007 | Dutta | 136/256 |
| 2008/0092953 A1* | 4/2008 | Lee | 136/261 |
| 2008/0156366 A1* | 7/2008 | Kim et al. | 136/255 |
| 2008/0264479 A1* | 10/2008 | Harris | H01L 51/422 136/255 |
| 2010/0024869 A1* | 2/2010 | Wang et al. | 136/249 |
| 2010/0186805 A1* | 7/2010 | Krunks et al. | 136/255 |
| 2010/0229921 A1* | 9/2010 | Farris et al. | 136/249 |
| 2011/0244623 A1* | 10/2011 | Lee | 438/85 |
| 2012/0097215 A1* | 4/2012 | Vermeersch | H01L 31/02008 136/246 |

FOREIGN PATENT DOCUMENTS

| | | | | |
|---|---|---|---|---|
| KR | 1020100097549 A | | 9/2010 | |
| KR | 1020100123425 A | | 11/2010 | |
| KR | 1020110001649 A | | 1/2011 | |
| KR | WO 2011046264 A1 * | | 4/2011 | ..... H01L 31/022466 |

\* cited by examiner

SOLAR CELL HAVING A DOUBLE-SIDED STRUCTURE, AND METHOD FOR MANUFACTURING SAME

TECHNICAL FIELD

The present invention relates to a solar cell, and more particularly, to a double-sided solar cell in which light generating structures are formed on both surfaces of a substrate, and a method of manufacturing the same.

BACKGROUND ART

In recent years, research into renewable energy resources that may replace fossil fuel has become an important issue. Among renewable energy resources into which research has been conducted, photogeneration, that is, solar cell-related techniques, have the advantages of the sun serving as an infinite energy source and a pollution-free pure energy source.

In contrast, high product prices and low generation efficiencies of solar cells act as disadvantages in large-scale power production using solar cells. To overcome these problems, research into new materials and structures of solar cells has progressed, and solar cells using compounds such as $CuInS_2$ (CIS) and $CuInGaSe_2$ (CIGS) have been suggested. Both CIS and CIGS have a high light absorptivity of about $5 \times 10^5$ $cm^{-1}$, CIS has an energy band of about 1.5 eV, and CIGS has an energy band of about 1.36 eV. Also, since CIS and CIGS have low toxicities, it is appreciated that CIS and CIGS may be highly utilized in thin-film solar cells.

Furthermore, with regard to structure rather than material, solar cells using nanostructures having quantum effects, such as nanoparticles or nanowires, have been proposed instead of conventional thin film structures.

Korean Patent Publication No. 2010-97549 discloses a technique of forming zinc oxide (ZnO) nanowires on a substrate and forming a thin silicon layer on the ZnO nanowires. Also, U.S. Pat. No. 7,653,560 discloses a structure in which a lower electrode is formed using conductive nanowires and a semiconductor layer is stacked on the lower electrode.

In a solar cell using a nanostructure, a relatively large surface area can be secured and a diffusion distance with respect to source carriers is short. Consequently, charges can be smoothly transported and power loss caused by an internal resistance of the solar cell can be reduced.

However, in the solar cell using a nanostructure, light of different wavelength ranges cannot be absorbed. When a multilayered structure is used to solve this problem, a substantial multilayered structure cannot be formed due to fundamental limitations caused by an inter-material lattice constant and the nanostructure.

Accordingly, a structure of a solar cell capable of ensuring a large surface area and absorbing light having different wavelength ranges is needed.

DISCLOSURE

Technical Problem

The present invention is directed to a solar cell capable of absorbing light having different wavelength ranges using a double-sided nanostructure.

The present invention is also directed to a method of manufacturing a solar cell used to attain the above objective.

Technical Solution

One aspect of the present invention provides a solar cell having a double-sided nanostructure. The solar cell includes a first photogenerating layer formed on a substrate and configured to absorb light having a short wavelength, and a second photogenerating layer disposed opposite the first photogenerating layer across the substrate and configured to absorb light having a long wavelength.

Another aspect of the present invention provides a method of manufacturing a solar cell having a double-sided nanostructure. The method includes forming a first negative electrode and a second negative electrode opposite each other on a substrate, the first negative electrode and the second negative electrode formed of a transparent conductive material, forming a first nanowire including a zinc oxide (ZnO) nanostructure on the first negative electrode and forming a second nanowire including a ZnO nanostructure on the second negative electrode, forming a first hole-transport layer including $CuInS_2$ (CIS) on the first nanowire, forming a second hole-transport layer including $CuInGaS_2$ (CIGS) on the second nanowire at a position opposite the first hole-transport layer, forming a first positive electrode on the first hole-transport layer, and forming a second positive electrode on the second hole-transport layer disposed opposite the first positive electrode.

Advantageous Effects

According to the present invention, nanostructures are formed on both surfaces of a substrate, and light is absorbed through the both surfaces of the substrate. A conventional tandem solar cell gives rise to several problems due to a multilayered stack structure, while a solar cell according to the present invention includes nanostructures formed on both surfaces of a substrate and can absorb light having a wide wavelength range from a single light source. Accordingly, photogeneration efficiency of the solar cell can be maximized.

In addition, independent photogenerating layers are formed on both surfaces of a substrate so that the generation of an internal resistance caused by serial connection of a conventional tandem structure can be minimized. The internal resistance is known as a factor that causes power loss of the solar cell.

Furthermore, zinc oxide (ZnO) nanowires are formed using an electrochemical deposition process so that nanowires having a uniform size and density can be formed on the both surfaces of the substrate. The formed nanowires can increase the transport efficiency of charges and minimize power loss in the solar cell.

MODE FOR INVENTION

Figure 1:
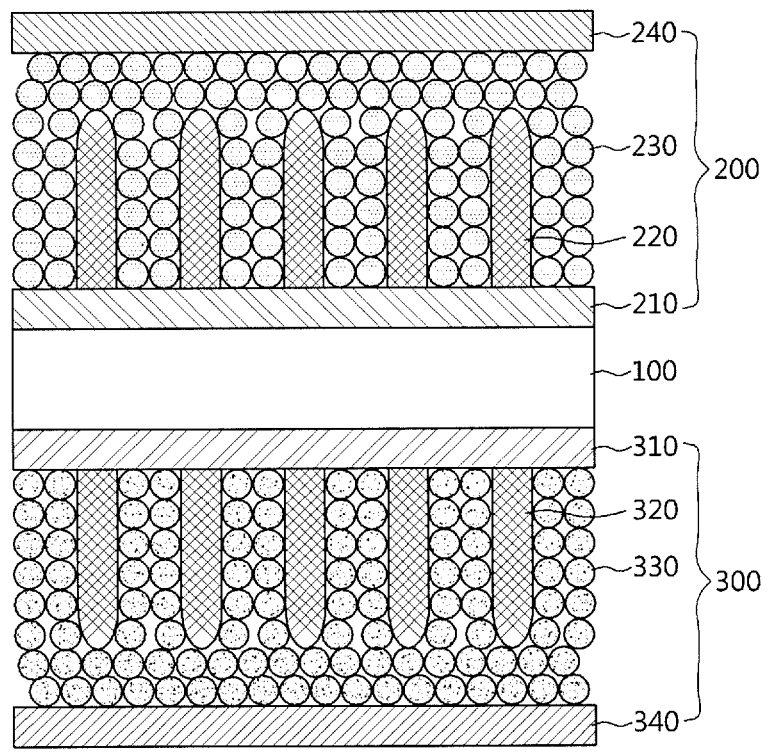
FIG. 1 is a cross-sectional view of a solar cell having a double-sided nanostructure according to an exemplary embodiment of the present invention.

Accordingly, while the invention can be modified in various ways and take on various alternative forms, specific embodiments thereof are shown in the drawings and described in detail below as examples. There is no intent to limit the invention to the particular forms disclosed. On the contrary, the invention is to cover all modifications, equivalents, and alternatives falling within the spirit and scope of the appended claims. Elements of the example embodiments are consistently denoted by the same reference numerals throughout the drawings and detailed description.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention will now be described more fully with reference to the accompanying drawings, in which exemplary embodiments of the invention are shown.

Embodiment

FIG. 1 is a cross-sectional view of a solar cell having a double-sided nanostructure according to an exemplary embodiment of the present invention.

Referring to FIG. 1, the solar cell according to the present invention may include a substrate 100, a first photogenerating layer 200, and a second photogenerating layer 300.

The first photogenerating layer 200 may be disposed opposite the second photogenerating layer 300 across the substrate 100.

For example, the first photogenerating layer 200 may include a first negative electrode 210, first nanowires 220, a first hole-transport layer 230, and a first positive electrode 240.

The first negative electrode 210 is formed on the substrate 100 formed of a transparent material. Also, the first negative electrode 210 is a conductive material formed of a transparent material. Accordingly, the first negative electrode 210 may include indium tin oxide (ITO), aluminum-doped zinc oxide (AZO), gallium-doped ZnO (GZO), magnesium-doped ZnO (MGO), or molybdenum (Mo)-doped ZnO.

In addition, the first nanowires 220 are formed on the first negative electrode 210. The first nanowires 220 preferably include ZnO. The ZnO may conduct electrons generated at the first hole-transport layer 230 or at an interface between the ZnO and the first hole-transport layer 230 to the first negative electrode 210 disposed under the ZnO. Each of the first nanowires 220 formed of ZnO may have a regular shape or an irregular shape.

In the present invention, although FIG. 1 illustrates a case in which the first nanowires 220 are aligned perpendicular to a planar surface formed by the first negative electrode 210, the first nanowires 220 may be formed at various angles to the planar surface formed by the first negative electrode 210 according to a method of forming the first nanowires 220. Also, in some embodiments, a seed layer formed of ZnO may be formed between the first nanowires 220 and the first negative electrode 210. The seed layer may induce growth of the first nanowires 220 formed of ZnO during a subsequent process.

The first hole-transport layer 230 may be formed on the first nanowires 220. The first hole-transport layer 230 may be formed to fill spaces between the first nanowires 220, which are ZnO nanowires. In particular, the first hole-transport layer 230 may include $CuInS_2$ (CIS). Also, the first hole-transport layer 230 may be adhered in the form of nanoparticles to the first nanowires 220 to fill spaces between the first nanowires 220. Also, the first hole-transport layer 230 may include CIS nanoparticles disposed on the first nanowires 220. The first hole-transport layer 230 is preferably disposed as a thin film type in a planar arrangement.

The first positive electrode 240 is disposed on the first hole-transport layer 230. The first positive electrode 240 may include a transparent conductive material, which may be nickel oxide (NiO), graphene, or fullerene.

Subsequently, the second photogenerating layer 300 may include a second negative electrode 310, second nanowires 320, a second hole-transport layer 330, and a second positive electrode 340.

The second negative electrode 310 is formed on the substrate 100 formed of a transparent material and faces the first negative electrode 310 across the substrate 100. FIG. 1 illustrates a case in which the second negative electrode 310 is substantially formed on a bottom surface of the substrate 100. Here, a layer formed on the surface of a specific substrate or other layer is expressed as being "formed on" the specific substrate or other layer. However, it will be understood that when the second negative electrode 310 is referred to as being "on" the substrate 100, the second negative electrode 310 can be directly on the substrate 100 or intervening layers may also be present. The interpretation of the above-described expression is consistently applied throughout this specification.

The second negative electrode 310 formed on the substrate 100 is a conductive material formed of a transparent material. Accordingly, the second negative electrode 310 may include the same material as the first negative electrode 210 of the first photogenerating layer 200. That is, the second negative electrode 310 may include ITO, AZO, GZO, MGO, or Mo-doped ZnO.

In addition, the second nanowires 320 are formed on the second negative electrode 310. The second nanowires 320 preferably include ZnO. The ZnO may conduct electrons generated at the second hole-transport layer 330 or an interface between the ZnO and the second hole-transport layer 330 to the second negative electrode 310.

Each of the second nanowires 320 formed of ZnO may have a regular shape or an irregular shape. In the present invention, although FIG. 1 illustrates a case in which the second nanowires 320 are aligned perpendicular to a planar surface formed by the second negative electrode 310, the second nanowires 320 may be formed at various angles to the planar surface formed by the second negative electrode 310 according to a method of forming the second nanowires 320. Also, in some embodiments, a seed layer formed of ZnO may be formed between the second nanowires 320 and the second negative electrode 310. The seed layer may induce growth of the second nanowires 320 formed of ZnO during a subsequent process.

The second hole-transport layer 330 is formed on the second nanowires 320. The second hole-transport layer 330 may be formed to fill spaces between the second nanowires 320, which are ZnO nanowires. In particular, the second hole-transport layer 330 may be adhered in the form of nanoparticles to the second nanowires 320 to fill the spaces between the second nanowires 320. Also, the second hole-transport layer 330 is preferably disposed as a thin film type on the second nanowires 320 in a planar arrangement.

The second positive electrode 340 is disposed on the second hole-transport layer 330. The second positive electrode 340 may include a transparent conductive material, such as molybdenum (Mo), aluminum (Al), gold (Au), copper (Cu), platinum (Pt), silver (Ag), tungsten (W), nickel (Ni), zinc (Zn), titanium (Ti), zirconium (Zr), hafnium (Hf), cadmium (Cd), or lead (Pb).

FIGS. 2 through 6 are cross-sectional views illustrating a method of manufacturing the solar cell of FIG. 1, according to an exemplary embodiment of the present invention.

Figure 2:
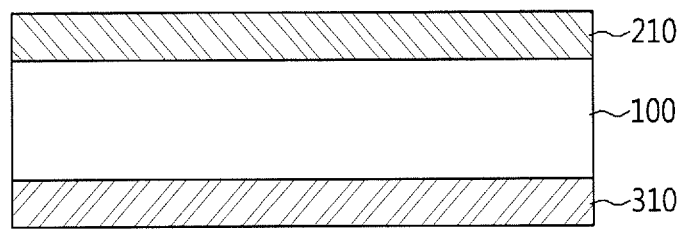
FIGS. 2 through 6 are cross-sectional views illustrating a method of manufacturing the solar cell of FIG. 1, according to an exemplary embodiment of the present invention.

Referring to FIG. 2, a first negative electrode 210 and a second negative electrode 310 are formed on both surfaces of a transparent substrate 100. The first negative electrode 210 and the second negative electrode 310 are formed of a transparent conductive material. Accordingly, the first negative electrode 210 and the second negative electrode 310 include ITO, AZO, GZO, MGO, or Mo-doped ZnO. The first negative electrode 210 and the second negative electrode 310 are formed using an ordinary deposition process.

Figure 3:
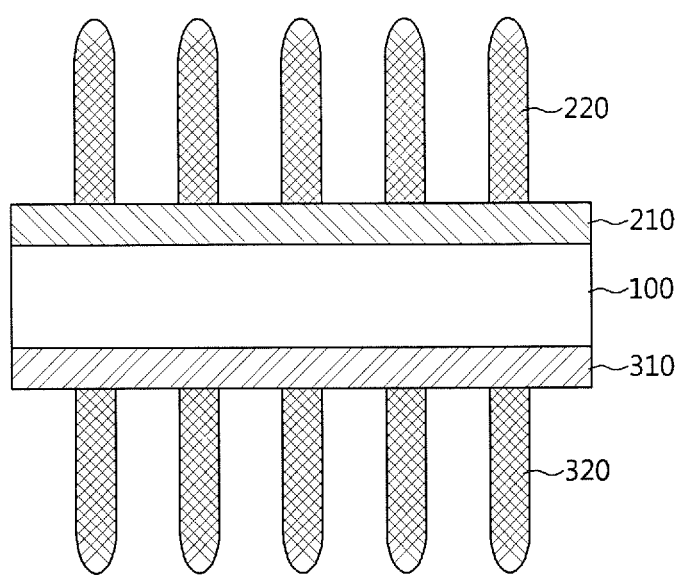

Referring to FIG. 3, first nanowires 220 and second nanowires 320 are respectively formed on the first negative electrode 210 and the second negative electrode 310 formed with reference to FIG. 2.

That is, the first nanowires 220 are formed on the first negative electrode 210, and the second nanowires 320 are formed on the second negative electrode 310. The nanowires 220 and 320 are formed as ZnO nanowires.

The ZnO nanowires are formed using, for example, a hydrothermal synthesis process. That is, the ZnO nanowires may be formed by dipping the substrate 100 in a ZnO precursor solution and performing a heating process.

In addition, the ZnO nanowires may be formed using an electrochemical deposition process. For instance, after the substrate 100 shown in FIG. 2 is dipped in the ZnO precursor solution, electrodes are put into the ZnO precursor solution, and then connected to the first negative electrode 210 and the second negative electrode 310. Due to the behavior of Zn ions relative to an applied voltage, the first nanowires 220 may be formed on the first negative electrode 210, and the second nanowires 320 may be formed on the second negative electrode 310.

The first nanowires 220 and the second nanowires 320, which are the formed ZnO nanowires, may protrude from the substrate 100 and be a predetermined space apart from each other.

Figure 4:
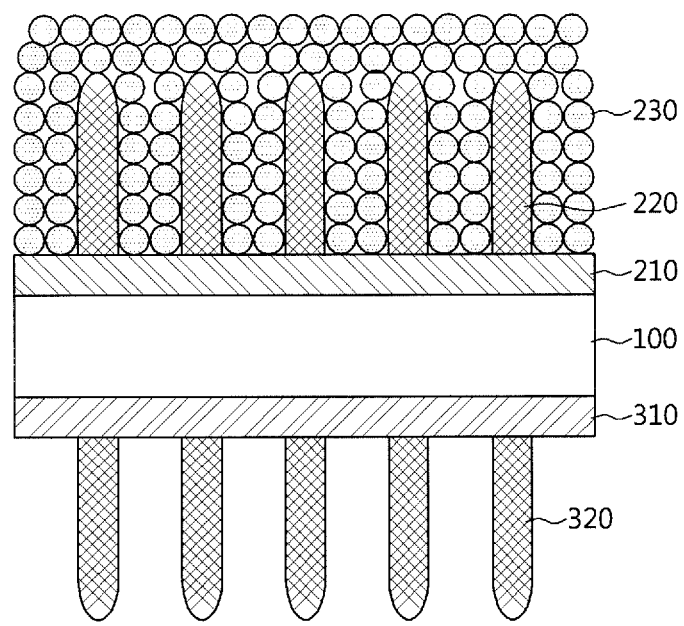

Referring to FIG. 4, a first hole-transport layer 230 is formed on the first nanowires 220. The first hole-transport layer 230 include CIS. The first hole-transport layer 230 may be formed by spin-coating a solution in which CIS nanoparticles are dispersed.

To form the first hole-transport layer 230 only on the first nanowires 220, the second nanowires 320 formed on a rear surface of the substrate 100 should be shielded in advance. For example, the second nanowires 320 may be shielded using a chemically stable polymer film. Thus, permeation of the solution in which the CIS nanoparticles are dispersed onto the second nanowires 320 may be prevented. The first hole-transport layer 230 may be formed by repeating the spin coating process several times.

Figure 5:
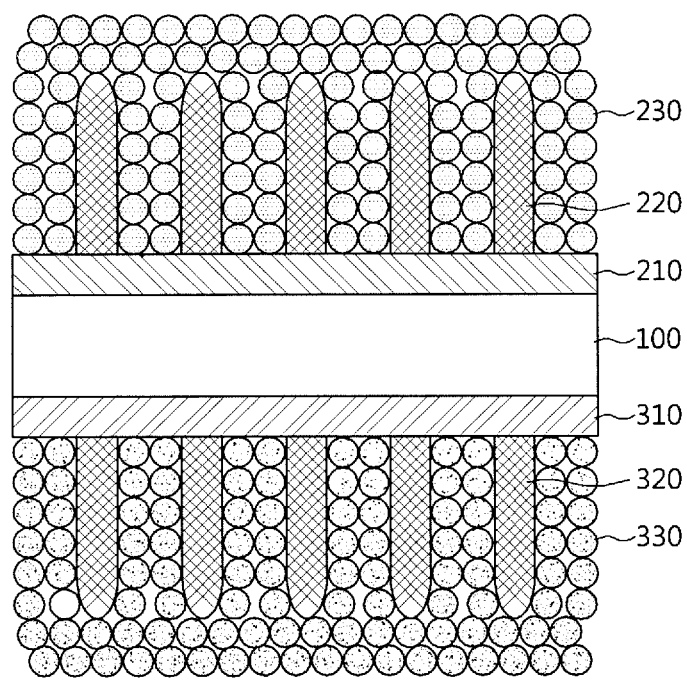

Referring to FIG. 5, a second hole-transport layer 330 is formed on the second nanowire 320. The second hole-transport layer 330 may be formed by spin-coating a solution in which CIGS nanoparticles are dispersed. Also, before the second hole-transport layer 330 is faulted using the CIGS nanoparticles, the polymer film adhered to the second nanowires 320 in FIG. 4 is removed, and the polymer film is adhered to the first hole transport layer 230. Thus, the solution in which the CIGS nanoparticles are dispersed may be cut off from the first hole-transport layer 230.

Figure 6:
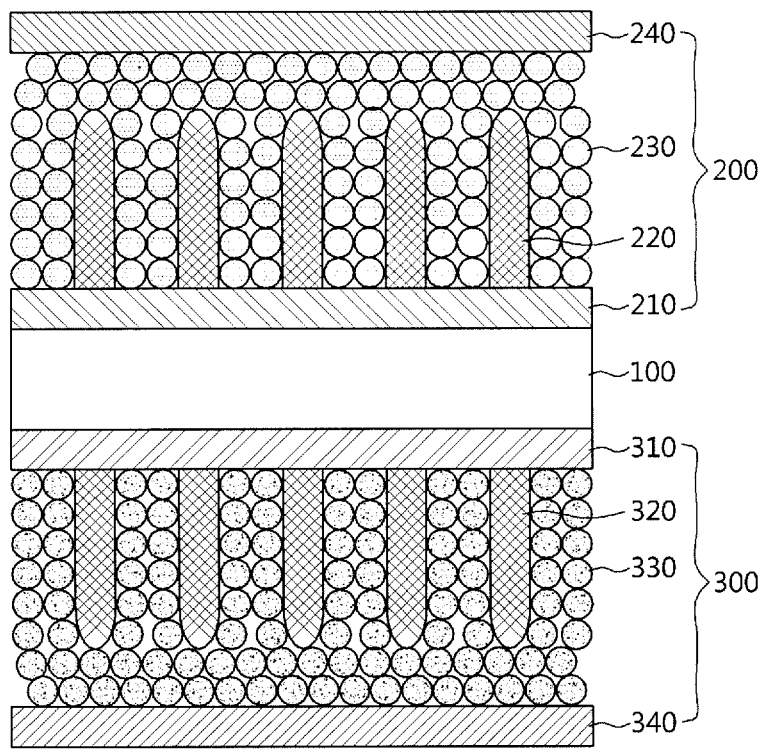

Referring to FIG. 6, a first positive electrode 240 is formed on the first hole-transport layer 230, and a second positive electrode 340 is formed on the second hole-transport layer 330. When one positive electrode is formed, another positive electrode corresponding thereto is preferably shielded by a polymer film. For example, while the first positive electrode 240 is formed of NiO, graphene, carbon nanotubes (CNTs), fullerene, or a fullerene composite, the second hole-transport layer 330 is shielded by a polymer film.

In addition, after forming the first positive electrode 240, the second positive electrode 340 may be formed. During the formation of the second positive electrode 340, the first positive electrode 240 may be shielded. Accordingly, a second positive electrode 340 is formed on the second hole-transport layer 330. The second positive electrode 340 may include Mo, Al, Au, Cu, Pt, Ag, W, Ni, Zn, Ti, Zr, Hf, Cd, or Pb. The first positive electrode 240 and the second positive electrode 340 may be formed using an ordinary deposition process.

When each of the first positive electrode 240 and the second positive electrode 340 needs to have a predetermined pattern shape, the first positive electrode 240 and the second positive electrode 340 may be formed by means of a deposition process and an etching process using a photolithography process. In addition, the first positive electrode 240 and the second positive electrode 340 may be patterned by means of a deposition process using a shadow mask for a deposition process. Furthermore, the formation of the first positive electrode 240 and the second positive electrode 340 may include forming a photoresist pattern, depositing a positive electrode material, and removing the photoresist pattern using a lift-off process.

Preparation Example

To begin with, a substrate on whose both surfaces a first negative electrode and a second negative electrode had been formed was prepared as shown in FIG. 2. The substrate was a glass substrate, and the first negative electrode and the second negative electrode were formed of ITO. After the substrate having ITO formed on both of its surfaces was cleaned using acetone and a 2-prophenol solution, the remaining cleaning solution was removed using deionized water. Thereafter, the substrate was completely dried using $N_2$ gas.

In addition, the substrate was processed for about 10 minutes in a ultraviolet (UV)-ozone cleaner to improve interfacial characteristics between ITO and a material to be grown on the surface of ITO.

To perform an electrochemical deposition process on the surface of the ITO, a ZnO precursor solution was prepared. First nanowires and second nanowires were formed using the electrochemical deposition process.

To begin with, 5.0 mM of $Zn(NO_3)_2$ and 0.1 M of potassium chloride (KCl) were dissolved in 200 ml of DIW. KCl acted as a medium that facilitates a reaction. Due to the reaction, $Zn(NO_3)_2 \cdot 6H_2O$ was prepared as a hydrate. The hydrate acted as a precursor of $Zn^{2+}$ during the electrochemical deposition process.

The substrate having the ITO was put into the formed ZnO precursor solution, and ZnO nanowires were formed to prepare first nanowires and second nanowires on both surfaces of the substrate.

Three electrodes were used to electrochemically deposit the ZnO nanowires. A working electrode was connected to the ITO, a counter electrode was connected to a platinum (Pt) electrode, and a saturated calomel electrode was put into a precursor solution and acted as a reference electrode. After the connection of the electrodes was completed, a voltage of about −1.1 V was applied for about 4 hours at a temperature of about 70° C., and the ZnO wires were formed on the ITO. Thus, the ZnO nanowires were formed on both surfaces of the substrate to form first nanowires and second nanowires simultaneously. After the ZnO nanowires were formed, the grown ZnO nanowires were structurally stabilized using a rapid thermal annealing (RTA) process in the atmosphere at a temperature of about 400° C. for about 2 minutes.

Thereafter, a chlorobenzene solution in which CIS nanoparticles were dispersed was coated on the substrate using a spin coating process for about 1 minute at a rate of about 1500 rpm. A solvent was removed by applying heat so that CIS nanoparticles could be adhered to ZnO nanowires, and a thin film could be formed on the ZnO nanowires. Meanwhile, the opposite side of the substrate was covered with a parafilm, and corners of the substrate were sealed with an adhesive tape so that the permeation of the chlorobenzene solution could be prevented during the spin coating process.

Subsequently, the spin coating process was performed using the chlorobenzene solution in which CIS nanoparticles were dispersed, thereby inducing formation of a thin film on the ZnO nanowires or controlling the thickness of the thin film.

Thereafter, the parafilm adhered to a rear surface of the substrate was removed, and a parafilm was adhered to a first hole-transport layer formed of a CIS thin film.

In addition, CIGS nanoparticles were dispersed in a chlorobenzene solution, and the dispersed solution was spin-coated on the rear surface of the substrate for about 1 minute at a rate of about 1500 rpm. After the spin coating process, a solvent was removed by applying heat. Thus, the CIGS nanoparticles filled spaces between the second nanowires and were adsorbed on the surfaces of the second nanowires. The CIGS nanoparticles could be coated in the form of a thin film on the second nanowires according to the extent and the number of spin coating processes.

Preferably, the CIGS nanoparticles filled the spaces between the second nanowires using several spin coating processes, and formed a thin film on the second nanowires. Thus, a second hole-transport layer including CIGS was formed.

Subsequently, a heavily doped p-type NiO thin film was deposited on the CIS nanoparticle thin film serving as the first hole-transport layer to form a transparent first positive electrode. Also, a molybdenum (Mo) electrode was formed on the CIGS nanoparticle thin film serving as a second hole-transport layer disposed opposite the first hole-transport layer to form a second positive electrode.

Thus, photogenerating layers capable of absorbing light having different wavelengths were formed on both surfaces of the substrate 100.

Since CIS nanoparticles adhered to the first nanowires 220, which are ZnO nanowires formed on the front surface of the substrate 100, have a higher electron affinity than ZnO, electrons and holes could be easily separated from excitons generated due to light absorption at an interface between CIS and ZnO. Accordingly, the electrons separated from electron-hole pairs were transported to the first negative electrode 210 through the ZnO nanowires. Also, the holes were transported to the first positive electrode 240 through the first hole-transport layer 230 including CIS formed on the first nanowires 220 formed of ZnO. The first hole-transport layer 230 not only functioned to transport the holes but also served as an electron blocking layer capable of preventing electrons from leaking into the first positive electrode 240.

Since CIS has a wider energy band than CIGS, high-energy light having a short wavelengths was absorbed in the first photogenerating layer 200. Unabsorbed low-energy light having long wavelengths was transmitted through the first positive electrode 240 and the substrate 100 and absorbed in the second photogenerating layer 300.

The second hole-transport layer 330 including CIGS nanoparticles adhered to the second nanowires 320 of the second photogenerating layer 300 absorbed light having long wavelengths and formed electron-hole pairs from the light through the same mechanism as the above-described CIS nanoparticles. Electrons of the formed electron-hole pairs were transmitted to the second negative electrode 310 through the second nanowires 320 formed of ZnO, and holes were transmitted to the second positive electrode 340 through the second hole-transport layer 330 serving also as an electron blocking layer.

According to the present invention, nanostructures are formed on both surfaces of a substrate, and light is absorbed through the both surfaces of the substrate. A conventional tandem solar cell gives rise to several problems due to a multilayered stack structure, while a solar cell according to the present invention includes nanostructures formed on both surfaces of a substrate and can absorb light having a wide wavelength range from a single light source. Accordingly, photogenerating efficiency of the solar cell can be maximized.

In addition, independent photogenerating layers are formed on both surfaces of a substrate so that the generation of an internal resistance caused by serial connection of a conventional tandem structure can be minimized. The internal resistance is known as a factor that causes power loss of the solar cell.

Furthermore, ZnO nanowires are formed using an electrochemical deposition process so that nanowires having a uniform size and density can be formed on the both surfaces of the substrate. The formed nanowires can increase the transport efficiency of charges and minimize power loss in the solar cell.

While the present invention has been described in connection with exemplary embodiments thereof, the scope of the invention is not limited to the detailed description of the invention provided herein. It will be understood by those of ordinary skill in the art that various changes and modifications can be made to the described exemplary embodiments without departing from the spirit and scope of the invention as defined by the appended claims.

The invention claimed is:

1. A solar cell having a double-sided nanostructure comprising:
   a substrate;
   a first photogenerating layer disposed on a first surface of the substrate, the first photogenerating layer being configured to absorb light having a short wavelength; and
   a second photogenerating layer disposed on a second surface of the substrate and configured to absorb light having a long wavelength, the second surface of the substrate being opposite to the first surface of the substrate,
   wherein the first photogenerating layer comprises a first negative electrode disposed on the first surface of the substrate;
   first nanowires disposed on the first negative electrode and extending from a surface of the first negative electrode, the first nanowires respectively having a zinc oxide (ZnO) nanostructure;
   a first hole-transport layer including $CuInS_2$ (CIS) nanoparticles, wherein the CIS nanoparticles are adhered to the first nanowires to completely fill spaces between the first nanowires and are disposed on the first nanowires; and a first positive electrode on the first hole-transport layer, and wherein the second photogenerating layer comprises a second negative electrode disposed on the second surface of the substrate;

second nanowires disposed on the second negative electrode and extending from a surface of the second negative electrode, the second nanowires respectively having a ZnO nanostructure;

a second hole-transport layer including $CuInGaS_2$ (CIGS) nanoparticles, wherein the CIGS nanoparticles are adhered to the second nanowires to fill spaces between the second nanowires and are disposed on the second nanowires; and a second positive electrode on the second hole-transport layer.

2. The solar cell of claim 1, wherein the first negative electrode and the second negative electrode comprise indium tin oxide (ITO), aluminum-doped ZnO (AZO), gallium-doped ZnO (GZO), magnesium-doped ZnO (MGO), or molybdenum-doped ZnO.

3. The solar cell of claim 1, wherein the first nanowires and the second nanowires are formed by an electrochemical deposition process putting an electrode into a ZnO precursor solution and using the behavior of zinc ions relative to a voltage applied to the first negative electrode and the second negative electrode.

4. The solar cell of claim 1, wherein the first positive electrode includes nickel oxide (NiO), graphene, carbon nanotubes (CNTs), or fullerene.

5. The solar cell of claim 1, wherein the second positive electrode includes molybdenum (Mo), aluminum (Al), gold (Au), copper (Cu), platinum (Pt), silver (Ag), tungsten (W), nickel (Ni), zinc (Zn), titanium (Ti), zirconium (Zr), hafnium (Hf), cadmium (Cd), or lead (Pb).

* * * * *